United States Patent [19]

Osada et al.

[11] Patent Number: 5,409,864
[45] Date of Patent: Apr. 25, 1995

[54] SUBSTRATE FOR SEMICONDUCTOR APPARATUS

[75] Inventors: Mituo Osada; Yoshinari Amano; Nobuo Ogasa; Akira Ohtsuka, all of Itami, Japan

[73] Assignee: Sumitomo Electric Industries, Ltd., Osaka, Japan

[21] Appl. No.: 284,277

[22] Filed: Aug. 2, 1994

Related U.S. Application Data

[60] Continuation of Ser. No. 82,812, Jun. 28, 1993, abandoned, which is a continuation of Ser. No. 717,462, Jun. 17, 1991, abandoned, which is a division of Ser. No. 382,056, Jul. 13, 1989, Pat. No. 5,086,333, which is a continuation of Ser. No. 90,392, Aug. 27, 1987, abandoned, which is a continuation of Ser. No. 831,124, Feb. 21, 1986, abandoned, which is a continuation of Ser. No. 515,890, Jun. 21, 1983, abandoned.

[30] Foreign Application Priority Data

Jul. 26, 1992 [JP] Japan .................. 57-131026

[51] Int. Cl.⁶ ............................................. H01L 21/60
[52] U.S. Cl. ............................. 437/209; 437/247
[58] Field of Search ............... 437/209, 247; 257/684, 257/729

[56] References Cited

U.S. PATENT DOCUMENTS

| | | |
|---|---|---|
| 1,552,184 | 9/1925 | Adams . |
| 1,848,437 | 3/1932 | Sieger et al. . |
| 1,860,793 | 5/1932 | Weiger . |
| 2,763,822 | 9/1956 | Frola et al. ............ 317/234 |
| 2,971,251 | 2/1961 | Willemse ................. 29/195 |
| 3,097,329 | 7/1963 | Siemens .................. 357/81 |
| 3,204,158 | 8/1965 | Schreiner et al. ........ 357/67 |
| 3,423,203 | 1/1969 | Zdanuk et al. ........... 75/208 |
| 3,969,754 | 7/1976 | Kuniya et al. ........... 357/67 |
| 4,196,442 | 4/1980 | Kuniya et al. ........... 357/67 |
| 4,427,993 | 1/1984 | Fichot et al. ............. 357/67 |
| 4,451,540 | 5/1984 | Baird et al. .............. 428/615 |
| 4,680,618 | 7/1987 | Kuroda et al. ............ 357/74 |
| 5,086,333 | 2/1992 | Osada et al. . |
| 5,099,310 | 3/1992 | Osada et al. . |

FOREIGN PATENT DOCUMENTS

| | | |
|---|---|---|
| 1143588 | 2/1963 | Germany . |
| 2853951 | 7/1980 | Germany . |
| 50-62776 | 5/1975 | Japan . |
| 56-030092 | 3/1981 | Japan . |
| 57-152438 | 9/1982 | Japan . |
| 58-067049 | 4/1983 | Japan . |
| 857569 | 12/1960 | United Kingdom . |
| 931820 | 7/1963 | United Kingdom . |

OTHER PUBLICATIONS

German, *Liquid Phase Sintering*, N.Y. and London, 1985, pp. 160–163.
Jones, *Fundamendal Principles of Powder Metallurgy*, London, 1960, pp. 504–509, 770–773.
Sands, et al., *Powder Metallurgy Practice and Applications*, London, 1966, pp. 94–95.
Kosco, "New Low expansion alloys for semiconductor applications", *Solid State Technology*, Jan. 1969, pp. 47–49.
Hirschhorn, *Introduction to Powder Metallurgy*, N.Y., 1969, pp. 244–245.
Meyer, "How to Select Electrical Contacts", *Metal Progress*, US, vol. 88, Jun./1965–Dec./1965, pp. 92–95.
Yih and Wang, *Tungsten, Sources, Metallurgy, Properties and Applications*, New York and London, 1979, pp. 362–363.

(List continued on next page.)

*Primary Examiner*—Brian E. Hearn
*Assistant Examiner*—Kevin M. Picardat
*Attorney, Agent, or Firm*—Foley & Lardner

[57] ABSTRACT

This invention relates to a substrate for mounting a semiconductor chip in an integrated circuit wherein a sintered compact containing copper at 2 to 30 wt. % and tungsten and/or molybdenum is employed as a substrate which efficiently radiates heat developed from the semiconductor chip mounted thereon and said substrate having a thermal expansion coefficient similar to those of semiconductor chip and other enclosure materials.

3 Claims, No Drawings

OTHER PUBLICATIONS

Shinbun, *Powder Metallurgy and Sintered Materials*, Japan, 1964, pp. 264–267.

Benesovsky, *Powder Metallurgy and Sintered Materials*, Metallwerk Plansee AG & Co.KG, Germany, 1973, pp. 146–156.

*Elmet Contact Materials*, Metallwerk Plansee AG & Co., Germany, 1977.

Benesovsky, *Powder Metallurgy and Sintered Materials*, Metallwerk Plansee AG & Co., Germany, 1973, pp. 10–11.

*Elkonite Data Book*, P. R. Mallory & Co., Indianapolis, Ind., 1941, pp. 1–30.

*Resistance Welding Data Book*, P. R. Mallory & Co., Indianapolis, Ind., 1951. pp. 308–309.

*Mallory catalog*, P. R. Mallory & Co., Indianapolis, Ind., 1950, pp. 30–33.

*Mallory Product Guide*, P. R. Mallory & Co., Indianapolis, Ind., 1962, p. 22.

*Elkonite Refractory Metal Composites Catalog*, P. R. Mallory & Co., Indianapolis, Ind., 1962.

*Elkonite Refractory Metal Composites Catalog*, P. R. Mallory & Co., Indianapolis, Ind., 1968.

*Elkonite Catalog*, Contact Metals Welding Inc., Indianapolis, Ind., 1981, pp. 308–309.

*Thermkon Catalog*, Contact Metals Welding Inc., Indianapolis, Ind., 1982 (Copyright Registration Sep. 27, 1982.

Thermkon Trademark Registration No. 1,354,948, Aug. 20, 1985.

*Thermkon Catalog*, Contact Metals Welding Inc., Indianapolis, Ind., 1987.

SUBSTRATE FOR SEMICONDUCTOR APPARATUS

This application is a continuation of application Ser. No. 08/082,812, filed Jun. 28, 1993, now abandoned which is a continuation of application Ser. No. 07/717,462, filed Jun. 17, 1991, now abandoned which is a division of application Ser. No. 07/382,056, filed Jul. 13, 1989, now U.S. Pat. No. 5,086.333 which is a continuation of Ser. No. 07/090,392, filed Aug. 27, 1987, now abandoned which is a continuation of Ser. No. 06/831,124, filed Feb. 21, 1986, now abandoned which is a continuation of Ser. No. 06/515,890, filed Jun. 21, 1983, now abandoned.

This invention relates to a substrate for mounting a semiconductor chip in an integrated circuit or the like. An object of the invention is to provide a superior substrate for mounting the semiconductor chip, which substrate is capable of efficiently radiating heat developed from the mounted semiconductor chip and said substrate having a thermal expansion coefficient similar to those of semiconductor chip and other material surrounding the same.

Substrates for mounting semiconductor chips have conventionally been made of a Ni alloy consisting of Kovar (29% Ni—17% Co—Fe), etc., or ceramics such as alumina, forsterite etc.

Conventional substrates have thermal expansion coefficients similar to that of the semiconductor chip, and when high heat radiation is also required, various Cu alloys have been used.

However, recent remarkable progress in the semiconductor industry has promoted larger semiconductor chips or increased amounts of heat generation and the demand for a substrate material to meet both the characteristics of thermal expansion coefficient and heat radiation has been on the increase.

Under such conditions, tungsten, molybdenum, beryllia, etc., have been proposed as materials to meet both of the above characteristics.

Beryllia, however, in fact, is not usable from the standpoint of environmental pollution. Although the thermal expansion coefficient of tungsten or beryllia corresponds well to that of the semiconductor chip, it has a large difference from that of alumina often used as the enclosure material and also from that of GaAs which has recently been used in increasing amounts for semiconductor chips.

Furthermore, tungsten and molybdenum are inferior to beryllia in respect of heat radiation so as to be largely restricted in packaging design.

The inventors, after conducting research on elimination of the above defects in materials for conventional substrates for mounting semiconductor ships to thereby control the thermal expansion coefficient and obtain a substrate material of good heat conductivity, have arrived at the present invention.

In other words, the semiconductor chip bearing substrate of the present invention has a thermal expansion coefficient similar to those of semiconductor chips and enclosure materials, is superior in heat conductivity. It comprises a sintered compact containing copper at 2 to 30% and tungsten and/or molybdenum.

When electrical-insulation properties are required, the substrate is given a thin-layer surface coating of a ceramic or organic insulator, instead of conventional ceramic.

In this invention, there is employed Cu in the amount of 2 to 30 wt. % and W and/or Mo to obtain a thermal expansion coefficient of the substrate as similar as possible to those of Si and GaAs or sintered aliimina or other enclosure materials, thereby reducing, to the extent possible, the influence of stress caused by the mismatch between the thermal expansion coefficients of the substrate and semiconductor chip and enclosure material. Hence, a proper amount of Cu need only be selected in the above range corresponding to the formation and size of the package.

The inventive substrate containing Cu and W and/or Mo is produced by powder metallurgy, because the manufacture of the same by the melting method is difficult due to the melting point and specific gravity difference between Cu, W and Mo. Among the powder metallurgy methods, sintering and infiltration are preferable.

Also, it is possible to make the W and/or Mo skeleton by adding thereto an iron group element at 20 wt. % or less.

A preferred amount of iron group element to be added is below 5 wt. %, but even above that, when up to 20 wt. %, will form the skeleton.

The addition of an amount over 20 wt % however, is not preferred because the sintered compact produced is defective in thermal characteristics and thus will not attain the objects of the invention.

The amount of iron group element, even when added to both W and Mo, can be added to W or Mo independently.

As seen from the above, the substrate of the invention can meet the increasing demand for large and high density semiconductor chips and be applicable as a substrate for the GaAs chip which is being put into practical use together with an Si chip.

Next, embodiments of the invention will be detailed as follows.

Example 1

Tungsten and a powder mixture of the same and an iron group element were compacted in the size of 100×100×5 mm respectively, and sintered under an $H_2$ gas atmosphere at a temperature of 1000° to 1400° C., thereby obtaining an intermediate sintered compact with porosity of 1 to 5%. Cu was infiltrated into the sintered compact under the $H_2$ gas atmosphere at a temperature of 1200° C. to produce Cu—W alloy of Cu content of 1 to 40 wt. %.

The Cu—W alloy thus produced was measured for thermal expansion coefficient and thermal conductivity to obtain the results in Table 1.

In addition, the thermal expansion coefficients of $Al_2O_3$, Si, and GaAs were entered therein. The marks * in Table 1 represent comparative examples outside the scope of the invention.

TABLE 1

| No. | Alloy Composition | Thermal Expansion Coefficient ($\times 10^{-6}$/°C.) | Thermal Conductivity (cal/cm.sec.°C.) |
|---|---|---|---|
| 1* | 1CU—99W | 4.7 | 0.40 |
| 2 | 5Cu—95W | 5.2 | 0.45 |
| 3 | 10Cu—90W | 7.0 | 0.50 |
| 4 | 15Cu—85W | 7.9 | 0.54 |
| 5 | 20Cu—80W | 8.3 | 0.58 |
| 6 | 25Cu—75W | 9.0 | 0.62 |
| 7 | 30Cu—70W | 9.7 | 0.65 |
| 8* | 35Cu—65W | 11.0 | 0.69 |

TABLE 1-continued

| No. | Alloy Composition | Thermal Expansion Coefficient ($\times 10^{-6}$/°C.) | Thermal Conductivity (cal/cm.sec.°C.) |
|---|---|---|---|
| 9* | 40Cu—60W | 11.8 | 0.73 |
| 10 | 10Cu—89W—1Ni | 7.0 | 0.48 |
| 11 | 20Cu—79.5W—0.5Ni | 8.2 | 0.57 |
| 12 | 5Cu—80W—15Fe | 7.9 | 0.42 |
| 13 | 10Cu—79W—11Co | 8.1 | 0.46 |
| 14* | Al$_2$O$_3$ | 7.2 | |
| 15* | Si | 4.0 | |
| 16* | GaAs | 6.7 | |

In the above table, an IC package using a Cu—W alloy sintered compact (No. 3) of Cu content 10 wt. % as the substrate material for mounting an Si chip produced no heat distortion due to a small difference between the thermal expansion coefficients of the Si chip and other enclosure base materials made of Al$_2$O$_3$ during the mounting process and an extremely good heat radiation, as the device could produce an IC longer in life span and of high reliability.

Example 2

Molybdenum and a powder mixture of the same and iron group element were compacted to the size of 100×100×5 mm respectively, and then were sintered under an H$_2$ gas atmosphere at a temperature of 1000° to 1400° C., thereby obtaining an intermediate sintered compact with a porosity of 1 to 50%.

Copper was infiltrated into the intermediate sintered compact under an H$_2$ gas atmosphere at a temperature of 1200° C., thereby producing a Cu—Mo alloy of copper content of 1 to 50 wt. %.

The Cu—Mo alloy thus produced was measured for the thermal expansion coefficient and heat conductivity, thereby having obtained the results in Table 2.

In addition, the marks * represent comparative examples outside the scope of the invention.

TABLE 2

| No. | Alloy Composition | Thermal Expansion Coefficient ($\times 10^{-6}$/°C.) | Thermal Conductivity (cal/cm.sec.°C.) |
|---|---|---|---|
| 1* | 1Cu—99Mo | 5.3 | 0.35 |
| 2 | 5Cu—95Mo | 5.9 | 0.38 |
| 3 | 10Cu—90Mo | 6.5 | 0.41 |
| 4 | 15Cu—85Mo | 7.1 | 0.44 |
| 5 | 20Cu—80Mo | 7.9 | 0.48 |
| 6 | 25Cu—75Mo | 8.4 | 0.50 |
| 7 | 30Cu—70Mo | 9.1 | 0.54 |
| 8* | 35Cu—65Mo | 9.7 | 0.57 |
| 9* | 40Cu—60Mo | 10.3 | 0.60 |
| 10* | 50Cu—50Mo | 11.5 | 0.66 |
| 11 | 10Cu—89.5Mo—0.5Ni | 6.5 | 0.39 |
| 12 | 15Cu—82.0Mo—3.0Ni | 7.2 | 0.41 |
| 13 | 5Cu—78Mo—17Fe | 8.2 | 0.36 |
| 14 | 10Cu—82Mo—8Co | 7.8 | 0.40 |

In the above Table 2, an IC package using a Cu—Mo alloy sintered compact (No. 4) as the substrate base material for mounting the Si chip produced no heat distortion at all due to a small difference between the thermal expansion coefficients of the Si chip and other enclosure base materials made of Al$_2$O$_3$ during the mounting process and extremely good heat radiation, and the device can obtain an IC longer in life span and of high reliability.

Example 3

Tungsten, molybdenum powder or tungsten—molybdenum alloy powder and the required amounts of copper powder and iron group powder were mixed as shown in Table 3, and the powder was mixed by an attrition mixer uniformly for three hours, compacted to the size of 30×30×5 mm under pressure of 1 t/cm$^2$, and then sintered under the H$_2$ gas atmosphere at a temperature of 1450° C. for one hour.

The alloy thus produced was measured for thermal expansion coefficient and heat conductivity, with the results being set forth in Table 3. In addition, in Table 3, the marks * represent comparative examples outside the scope of the invention.

TABLE 3

| No. | Alloy Composition | Thermal Expansion Coefficient ($\times 10^{-6}$/°C.) | Thermal Conductivity (cal/cm.sec.°C.) |
|---|---|---|---|
| 1 | 15Cu—85W | 8.2 | 0.50 |
| 2 | 20Cu—79W—1Ni | 8.5 | 0.48 |
| 3 | 20Cu—75W—5Co | 8.7 | 0.47 |
| 4 | 30Cu—68W—2Fe | 9.9 | 0.50 |
| 5 | 20Cu—70W—10Mo | 8.5 | 0.54 |
| 6* | 35Cu—65W | 11.5 | 0.61 |

What is claimed is:

1. (A) A method for mounting a semiconductor chip for use in an integrated circuit package which comprises mounting said chip on a substrate consisting essentially of W, Mo, or W and Mo, and 5 to 30 weight percent Cu, (B) the substrate being produced by a powder metallurgical method, and (C) the powder metallurgical method comprising the steps of: mixing W, Mo, or W and Mo, and Cu powders, forming a mixed powder compact and sintering said mixed powder compact in a hydrogen atmosphere at a temperature higher than the melting point of Cu.

2. The method of claim 1 in which the sintering of the above paragraph (C) is carried out at 1450° C.

3. The method according to any one of claims 1 or 2 wherein the substrate of the above paragraph (B) is one that has high thermal conductivity and that is equal in thermal expansion coefficient to the semiconductor chip enclosure materials.

* * * * *